US011473567B2

(12) United States Patent
Rowe

(10) Patent No.: US 11,473,567 B2
(45) Date of Patent: Oct. 18, 2022

(54) PROGRAMMABLE SURFACE

(71) Applicant: Toyota Motor Engineering & Manufacturing North America, Inc., Plano, TX (US)

(72) Inventor: Michael Paul Rowe, Pinckney, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 890 days.

(21) Appl. No.: 16/269,995

(22) Filed: Feb. 7, 2019

(65) Prior Publication Data

US 2020/0259426 A1     Aug. 13, 2020

(51) Int. Cl.
| F03G 7/06 | (2006.01) |
| H01L 41/047 | (2006.01) |
| F03G 7/00 | (2006.01) |
| G05B 15/02 | (2006.01) |
| B81B 3/00 | (2006.01) |
| H02N 2/00 | (2006.01) |

(Continued)

(52) U.S. Cl.
CPC ............ *F03G 7/062* (2021.08); *B81B 3/0054* (2013.01); *F03G 7/012* (2021.08); *F03G 7/027* (2021.08); *F03G 7/029* (2021.08); *F03G 7/0613* (2021.08); *F03G 7/0616* (2021.08); *G05B 15/02* (2013.01); *H01L 41/0477* (2013.01); *H02N 2/005* (2013.01); *B60R 7/04* (2013.01); *B60R 13/02* (2013.01)

(58) Field of Classification Search
CPC .......... F03G 7/062; F03G 7/012; F03G 7/027; F03G 7/029; F03G 7/0613; F03G 7/0616; B81B 3/0054; G05B 15/02; H01L 41/0477; H02N 2/005; B60R 7/04; B60R 13/02; B60R 7/00

USPC ............................ 60/527–529; 310/306–309
See application file for complete search history.

(56) References Cited

U.S. PATENT DOCUMENTS

| 2,241,086 A | 1/1939 | Gould |
| 4,286,910 A | 9/1981 | Conrad |
| 4,319,427 A | 3/1982 | Way, Jr. |

(Continued)

FOREIGN PATENT DOCUMENTS

| JP | H07303381 A | 11/1995 |
| JP | 2003034174 A | 2/2003 |

(Continued)

OTHER PUBLICATIONS

Coelho et al., "Surflex: A Programmable Surface for the Design of Tangible Interfaces," 2008 (6 pages).

(Continued)

*Primary Examiner* — Hoang M Nguyen
(74) *Attorney, Agent, or Firm* — Christopher G. Darrow; Darrow Mustafa PC

(57) ABSTRACT

The devices and systems described herein generally relate to programmable surfaces. A set of tiles in conjunction with actuators, allow for the surface to be constantly changeable from a first shape to an unlimited variety of second shapes. Once a desired second shape is achieved, the shape can be held by actuating the actuators. The system can include detection and maintenance of the shapes of the programmable surface by controlling which of the actuators are released and when they are released.

20 Claims, 7 Drawing Sheets

(51) Int. Cl.
*B60R 7/04* (2006.01)
*B60R 13/02* (2006.01)

(56) References Cited

U.S. PATENT DOCUMENTS

| | | | |
|---|---|---|---|
| 4,726,656 | A | 2/1988 | Schofield et al. |
| 4,848,179 | A | 7/1989 | Ubhayakar |
| 4,958,100 | A | 9/1990 | Crawley et al. |
| 4,964,062 | A | 10/1990 | Ubhayakar et al. |
| 5,021,798 | A | 6/1991 | Ubhayakar |
| 5,065,978 | A | 11/1991 | Albarda et al. |
| 5,222,668 | A | 6/1993 | Frankeny et al. |
| 5,502,345 | A | 3/1996 | Kahn et al. |
| 5,536,062 | A | 7/1996 | Spears |
| 5,668,432 | A | 9/1997 | Tominaga et al. |
| 6,050,468 | A | 4/2000 | Kelley |
| 6,065,978 | A | 5/2000 | Dehan et al. |
| 6,120,002 | A | 9/2000 | Biegelsen et al. |
| 6,215,221 | B1 | 4/2001 | Cabuz et al. |
| 6,490,960 | B1 | 12/2002 | Jackson et al. |
| 6,685,442 | B2 | 2/2004 | Chinn et al. |
| 6,702,301 | B1 | 3/2004 | Davies et al. |
| 6,720,402 | B2 | 4/2004 | Langer et al. |
| 6,830,071 | B2 | 12/2004 | Xu et al. |
| 6,939,291 | B2 | 9/2005 | Phee Soo Jay |
| 7,188,498 | B2 | 3/2007 | Browne et al. |
| 7,353,747 | B2 | 4/2008 | Swayze et al. |
| 7,484,735 | B2 | 2/2009 | Verbrugge et al. |
| 7,575,807 | B1 | 8/2009 | Barvosa-Carter et al. |
| 7,594,697 | B2 | 9/2009 | Browne et al. |
| 7,673,562 | B2 | 3/2010 | Pattekar et al. |
| 7,755,840 | B2 | 7/2010 | Batchko et al. |
| 7,892,630 | B1 | 2/2011 | McKnight et al. |
| 7,901,524 | B1 | 3/2011 | McKnight et al. |
| 7,905,538 | B2 | 3/2011 | Ukpai et al. |
| 7,909,403 | B2 | 3/2011 | Lawall et al. |
| 8,096,034 | B2 | 1/2012 | Barvosa-Carter et al. |
| 8,136,875 | B2 | 3/2012 | Laake |
| 8,222,799 | B2 | 7/2012 | Polyakov et al. |
| 8,231,563 | B2 | 7/2012 | Mauge et al. |
| 8,240,677 | B2 | 8/2012 | Browne et al. |
| 8,272,392 | B2 | 9/2012 | Pattekar et al. |
| 8,430,810 | B2 | 4/2013 | Hassidov et al. |
| 8,485,581 | B2 | 7/2013 | McKnight et al. |
| 8,863,608 | B2 | 10/2014 | Fischer et al. |
| 8,870,144 | B2 | 10/2014 | Zavattieri et al. |
| 9,061,118 | B2 | 6/2015 | Shoham et al. |
| 9,308,949 | B1 | 4/2016 | Mihelic et al. |
| 9,580,115 | B2 | 2/2017 | Haller |
| 9,764,113 | B2 | 9/2017 | Tuval et al. |
| 9,790,968 | B2 | 10/2017 | Yang et al. |
| 9,919,418 | B2 | 3/2018 | Hashimoto |
| 9,927,786 | B2 | 3/2018 | Dewitte |
| 9,937,966 | B1 | 4/2018 | Yoon et al. |
| 9,970,564 | B2 | 5/2018 | Dankbaar et al. |
| 10,058,647 | B2 | 8/2018 | Roche et al. |
| 10,224,279 | B2 * | 3/2019 | Or-Bach ............. H01L 45/085 |
| 10,302,586 | B2 | 5/2019 | Sun et al. |
| 10,465,723 | B2 | 11/2019 | Ilievski et al. |
| 10,631,083 | B1 | 4/2020 | Gandhi et al. |
| 10,640,033 | B1 | 5/2020 | Gandhi et al. |
| 10,682,903 | B1 | 6/2020 | Gandhi et al. |
| 10,682,931 | B2 | 6/2020 | Rowe et al. |
| 10,746,206 | B1 | 8/2020 | Rowe et al. |
| 10,749,448 | B2 | 8/2020 | Lindsay et al. |
| 10,797,217 | B2 | 10/2020 | Hakkens et al. |
| 10,946,535 | B2 | 3/2021 | Gandhi et al. |
| 2002/0100888 | A1 | 8/2002 | Sharma et al. |
| 2004/0107829 | A1 | 6/2004 | Davis et al. |
| 2004/0261411 | A1 | 12/2004 | MacGregor |
| 2005/0045480 | A1 | 3/2005 | Krumme |
| 2005/0198904 | A1 | 9/2005 | Browne et al. |
| 2005/0206096 | A1 | 9/2005 | Browne et al. |
| 2006/0032715 | A1 | 2/2006 | Barvosa-Carter et al. |
| 2006/0038745 | A1 | 2/2006 | Naksen et al. |
| 2007/0120438 | A1 | 5/2007 | Divoux |
| 2007/0246898 | A1 | 10/2007 | Keefe et al. |
| 2009/0052049 | A1 | 2/2009 | Batchko et al. |
| 2009/0115285 | A1 | 5/2009 | Najafi et al. |
| 2009/0255187 | A1 | 10/2009 | Alexander et al. |
| 2010/0066113 | A1 | 3/2010 | Browne et al. |
| 2010/0090497 | A1 | 4/2010 | Beckon |
| 2010/0258362 | A1 | 10/2010 | Trimmer |
| 2013/0092808 | A1 | 4/2013 | Adachi et al. |
| 2013/0255815 | A1 | 10/2013 | Brinkmann et al. |
| 2013/0318962 | A1 | 12/2013 | Joshi et al. |
| 2014/0109560 | A1 | 4/2014 | Ilievski et al. |
| 2014/0139450 | A1 * | 5/2014 | Levesque .............. G06F 3/0416 345/173 |
| 2015/0185849 | A1 * | 7/2015 | Levesque ................ G06F 3/011 340/407.2 |
| 2015/0197173 | A1 | 7/2015 | Hulway |
| 2015/0367765 | A1 | 12/2015 | Kupina |
| 2017/0036709 | A1 | 2/2017 | Metka et al. |
| 2017/0080987 | A1 | 3/2017 | Morgan |
| 2017/0240224 | A1 | 8/2017 | Gaylard et al. |
| 2018/0172172 | A1 | 6/2018 | Oehler et al. |
| 2019/0032684 | A1 | 1/2019 | Kowalewski et al. |
| 2019/0044246 | A1 * | 2/2019 | Pitsillides .......... H01Q 15/0086 |
| 2019/0296217 | A1 | 9/2019 | Jung et al. |
| 2019/0312193 | A1 | 10/2019 | Pelssers et al. |
| 2019/0322324 | A1 | 10/2019 | Hurst |
| 2019/0326505 | A1 | 10/2019 | Pelssers et al. |
| 2020/0032822 | A1 | 1/2020 | Keplinger et al. |
| 2020/0066963 | A1 | 2/2020 | Johnson et al. |
| 2020/0130202 | A1 | 4/2020 | Gandhi et al. |
| 2020/0130321 | A1 | 4/2020 | Gandhi et al. |
| 2020/0132213 | A1 | 4/2020 | Gandhi et al. |
| 2020/0132223 | A1 | 4/2020 | Prokhorov et al. |
| 2020/0136525 | A1 | 4/2020 | Gandhi et al. |
| 2020/0136526 | A1 | 4/2020 | Gandhi et al. |
| 2020/0156237 | A1 | 5/2020 | Tang et al. |
| 2020/0156314 | A1 * | 5/2020 | Rowe .................... B22F 1/0545 |
| 2020/0182269 | A1 | 6/2020 | Rowe |
| 2020/0189469 | A1 | 6/2020 | Gandhi et al. |
| 2020/0216121 | A1 | 7/2020 | Gandhi et al. |
| 2020/0238854 | A1 | 7/2020 | Gandhi et al. |

FOREIGN PATENT DOCUMENTS

| | | | |
|---|---|---|---|
| JP | 2007097292 A | | 4/2007 |
| KR | 20050056526 A | | 6/2005 |
| WO | 2017077541 A1 | | 5/2017 |
| WO | 2018175741 A1 | | 9/2018 |

OTHER PUBLICATIONS

Acome et al., "Hydraulically Amplified Self-Healing Electrostatic Actuators with Muscle-Like Performance," Science, vol. 359, Issue 6371, pp. 61-65, Jan. 5, 2018 (6 pages).

Knoss, "Next-gen flexible robots move and heal like us," CU Boulder Today, Jan. 4, 2018, retrieved from the Internet: <https://www.colorado.edu/today/2018/01/04/next-gen-flexible-robots-move-and-heal-US>, [retrieved Mar. 30, 2018] (6 pages).

Tang et al., "Novel Design and Three-Dimensional Printing of Variable Stiffness Robotic Grippers," Dec. 2016, ASME Journal of Mechanisms and Robotics, vol. 8, pp. 061010-1 to 061010-15 (15 pages).

SMC Tech, "Precision Regulator: Series IR1000/2000/3000", SMC Tech, pp. 713-725 and 1-19, 2015 (53 pages).

* cited by examiner

FIG. 1B
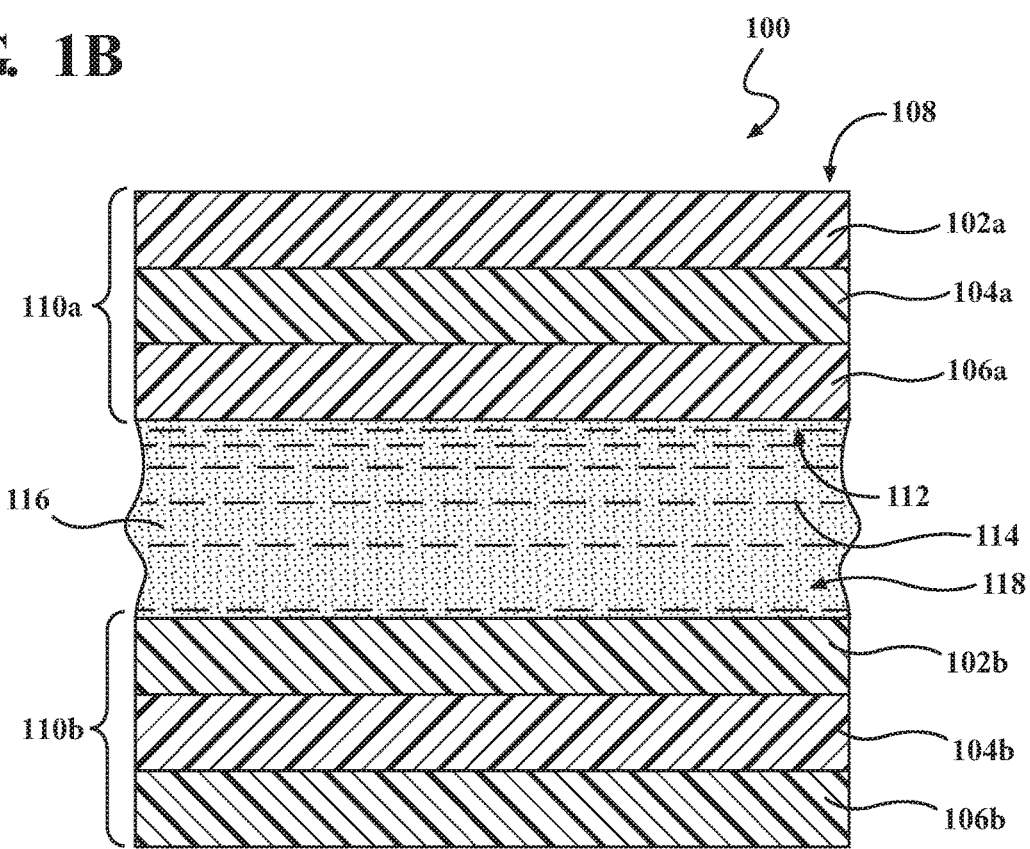
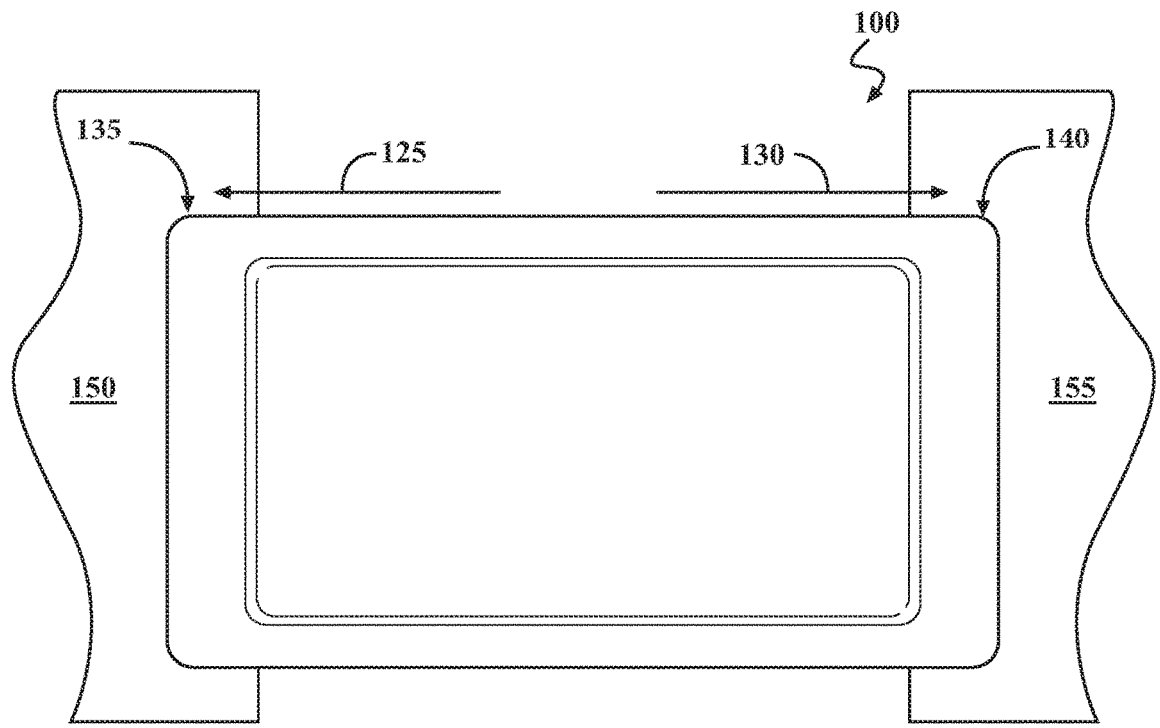
FIG. 1C

US 11,473,567 B2

PROGRAMMABLE SURFACE

TECHNICAL FIELD

The subject matter described herein generally relates to changeable surfaces and, more particularly, surfaces which can be deformed and programmed to maintain the achieved form.

BACKGROUND

Various supporting devices, such as cup holders, tables and the like, used in a car or a home, are beneficial for a number of elements of modern life. For example, drink holders, tables, change drawers, and the like are all supporting devices found in a modern vehicle or home. Supporting devices, which are used for holding and supporting other objects, add to the convenience of modern life by protecting the supported objects (e.g., sunglasses holders in a visor for sunglasses) and allowing access without carrying that object by other mechanisms. As well, various supporting devices allow people to multitask in the home or driving environment without compromising safety or attentiveness.

SUMMARY

Disclosed herein is a programmable surface, capable of deforming and maintaining one or more shapes, and returning to an original shape. In one embodiment, an actuator is disclosed. The actuator can include a locking portion comprising a locking insulating elastomer. The locking portion can include an inner surface forming at least a portion of a fluid-impermeable compartment, the fluid-impermeable compartment including a dielectric fluid and a particulate material. The actuator can further include a first conducting portion connected to an outer surface of the locking portion, the conducting portion comprising a conducting elastomer. The actuator can further include a second conducting portion connected to an outer surface of the locking portion, the conducting portion comprising a conducting elastomer, the second conducting portion being separated from the first conducting portion by the fluid-impermeable compartment. The actuator can further include an insulating portion surrounding an exterior surface of the first conducting portion and the second conducting portion, the insulating portion comprising an insulating elastomer.

In another embodiment, a programmable surface is disclosed. The programmable surface can include a tile, a power source, and an actuator. The tile can include a base having an upper surface and a switch to alter an electric current in response to an input. The power source can be in electrical communication with the switch. The actuator can be attached to the tile and in electrical communication with the electric current. The actuator can include a locking portion comprising a locking insulating elastomer, the locking portion including an inner surface forming at least a portion of a fluid-impermeable compartment, the fluid-impermeable compartment including a dielectric fluid and a particulate material. The actuator can further include a first conducting portion connected to an outer surface of the locking portion, the conducting portion comprising a conducting elastomer. The actuator can further include a second conducting portion connected to an outer surface of the locking portion, the conducting portion comprising a conducting elastomer, the second conducting portion being separated from the first conducting portion by the fluid-impermeable compartment. The actuator can further include an insulating portion surrounding an exterior surface of the first conducting portion and the second conducting portion, the insulating portion comprising an insulating elastomer.

In another embodiment, a programmable surface system is disclosed. The programmable surface system can include a programmable surface. The programmable surface can include a plurality of tiles and a plurality of actuators. The programmable surface system can further include a surface control system for controlling the programmable surface. The surface control system can include one or more processors; and a memory communicably coupled to the one or more processors. The memory can store an activation determination module including instructions that when executed by the one or more processors cause the one or more processors to release one or more of the actuators in response to an activation signal received from the programmable surface, the release involving removing an electrical current from the actuators. The memory can further store a shape assignment module including instructions that when executed by the one or more processors cause the one or more processors to activate the actuators at a desired deformation level.

BRIEF DESCRIPTION OF THE DRAWINGS

So that the manner in which the above recited features of the present disclosure can be understood in detail, a more particular description of the disclosure, briefly summarized above, may be had by reference to the embodiments, some of which are illustrated in the appended drawings. It is to be noted, however, that the appended drawings illustrate only typical embodiments of this disclosure and are therefore not to be considered limiting of its scope. The disclosure may admit to other equally effective embodiments.

FIGS. 1A-1C are illustrations of actuators, according to one or more embodiments.

To facilitate understanding, identical reference numerals have been used, wherever possible, to designate identical elements that are common to the figures. Additionally, elements of one embodiment may be advantageously adapted for utilization in other embodiments described herein.

DETAILED DESCRIPTION

Supporting devices, such as tables and containers, all require a certain amount of space to perform their assigned task. For example, drink holders commonly are of a specific size and shape to hold a variety of cup sizes. This means that drink holders can take up an equivalent amount of space, regardless whether the drink holder is occupied by a cup or not. The same can be said for a variety of holders available throughout the vehicle, home, or office. Further, the supporting devices are not necessarily in use at any given time. In another example, though a vehicle may have space reserved for a change holder, the change holder may be empty or only partially full. This creates wasted space in an environment, with no clear benefit for the occupant.

Disclosed herein are programmable surfaces and methods of making and using the same. The programmable surface employs a plurality of actuators. The programmable surface can be variety of patterns, such as a tessellation pattern, of tiles connected by actuators. In one embodiment, the tiles are rigid. In further embodiments, the tiles are flexible or semi-flexible, such that the flexibility can be maintained once a final shape is achieved. In one example, the actuators can include a friction producing agent, such as a rough or grit material, to increase actuator rigidity and/or locking.

One or more of the tiles can include a sensor, such as a pressure sensor. The sensor can be located on a surface of the tile. The sensor can be exposed to the customer so that applying pressure to it triggers the switch. Triggered switches turn off the power to the adjacent actuator, making them elastic and pliable, so that the rigid tiles can be moved. Once the desired deformations to the surface are made, the power is returned to all actuators to freeze the new surface deformation pattern, such as for a user or customer defined cup holder, a moldable arm rest, a change drawer or other surfaces. The programmable surface is then 'reset' to a generic state by removing power from all actuators and allowing it to spring back into its original shape. It is then ready to be deformed again at will. The tile and actuator sizes can be as large or small as desired per the desired deformation shape resolution. The embodiments disclosed herein are more clearly described with reference to the figures below.

Figure 1A:
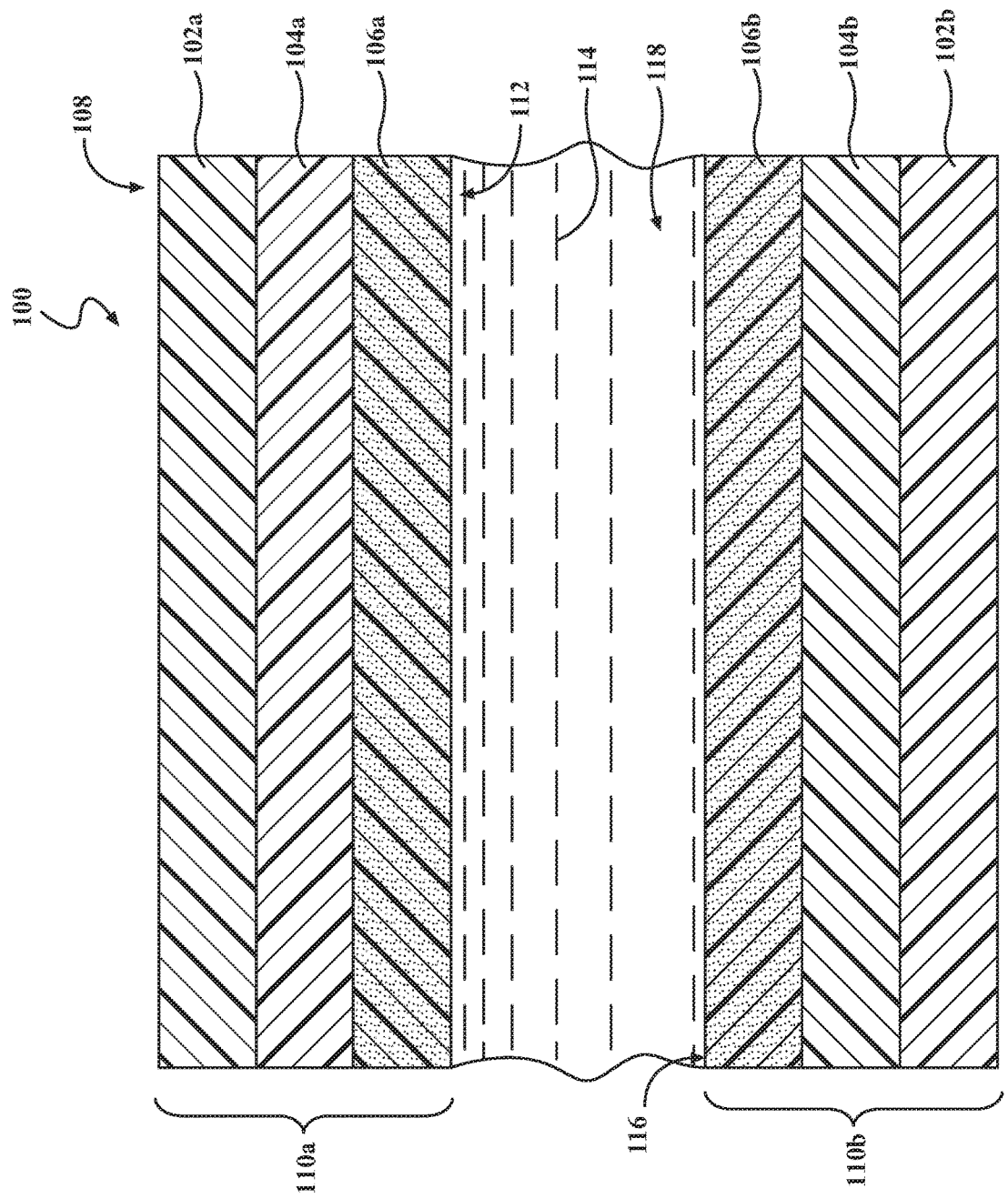

FIGS. 1A-1C are illustrations of an actuator 100, according to one or more embodiments. The actuator 100 can be a hydrostatic actuator. As will be described herein, the actuator 100 can be configured for selective locking and unlocking. The actuator 100 can have a pliable or semi-pliable body. The actuator 100 can be an electrostatic device capable of reducing movement or "locking" with the application of electric charge. "Locking", as used herein, relates to the ability of the actuator 100 to retain a specific shape, given an electric input. "Unlocking", as used herein, refers to the ability of the actuator 100 to return from a locked state to an original shape, in response to stopping the electrical input. The actuator 100 can be capable of changing shape in the absence of the electric charge, thus allowing the shape of the actuator 100 to be manipulated by other forces, such as gravitational forces. Thus, the actuator 100 has a first shape which is maintained in the absence of a secondary force, such as gravity (e.g., the weight of an object) or kinetic force. Once a secondary force is applied, electric charge to the actuator 100 can be discontinued, allowing the shape of the actuator 100 to change to a second shape due to the secondary force. The actuator 100 can then receive an electric charge, causing the actuator 100 to lock in place in the second shape. When the charge is removed, the actuator 100 can then return to the first shape.

FIGS. 1A and 1B depicts the components of the actuator 100, according to one or more embodiments. As shown here, the actuator 100 includes a fluid-impermeable membranes 110a and 110b and a dielectric fluid 114. The fluid-impermeable membranes 110a and 110b can be composed of layers, such as insulating portions 102a and 102b, conducting portions 104a and 104b, and locking portions 106a and 106b. "Portion", as used herein, relates to one or more components which form a layer, a portion of a layer, or structure in the fluid-impermeable membranes 110a and 110b of the actuator 100. The portions can have non-uniform coverage or thickness, as desired. The portions above are described as a single, uniform element or layer for simplicity purposes. However, the portions can include one or more of any of the layers, portions of layers, or variations as disclosed herein. As such, the portions may only partially extend the dimensions of the fluid-impermeable membranes 110a and 110b. As well, the portions of the fluid-impermeable membranes 110a and 110b can meet to form a seal, such that a chamber or compartment 118 is formed in the inner region of the fluid-impermeable membranes 110a and 110b.

The fluid-impermeable membranes 110a and 110b, or components thereof (e.g., the insulating portions 102a and 102b, the conducting portions 104a and 104b, and/or the locking portions 106a and 106b), can be flexible and/or elastic at one or more points and/or across one or more portions of the fluid-impermeable membranes 110a and 110b. In one embodiment, the fluid-impermeable membranes 110a and 110b, or components thereof, are completely flexible and elastic. In another embodiment, the fluid-impermeable membranes 110a and 110b is flexible across the entirety, but only elastic across one or more strips of the fluid-impermeable membranes 110a and 110b. In another embodiment, the fluid-impermeable membranes 110a and 110b is flexible and elastic at the insulating portion 102a and 102b and the locking portions 106a and 106b, but neither flexible nor elastic at the conducting portions 104a and 104b. One skilled in the art will understand the variety of combinations of flexibility, elasticity, and positioning of the portions of the fluid-impermeable membranes 110a and 110b, without further explicit recitation of specific examples herein.

The insulating portion 102a and 102b can form an exterior surface 108 of the fluid-impermeable membranes 110a and 110b. In one embodiment, the insulating portion 102a and 102b can form the entire exterior surface of the fluid-impermeable membranes 110a and 110b. The insulating portion 102a and 102b can be flexible and/or elastic at one or more portions. In one embodiment, the insulating portion 102a and 102b is entirely flexible and elastic. In another embodiment, the insulating portion 102a and 102b can have interspersed regions of flexibility, or flexibility and elasticity. The interspersed regions can be in a pattern or random, as desired. The insulating portion 102a and 102b can form an interface with the surface of one or more inner layers, such as the locking portions 106a and 106b and/or the conducting portions 104a and 104b.

The insulating portion 102a and 102b can include a polymer, an elastomeric polymer (elastomer) or both. The use of a plurality of different encapsulating elastomers and/or polymers of varying degrees of softness and hardness can be employed. The polymers used in embodiments described herein can further include the addition of a plasticizer, such as phthalate esters. The polymers or elastomers may be natural or synthetic in nature. Examples of elastomers usable as part of the insulating portion 102a and 102b can include an insulating elastomer, such as nitrile, ethylene propylene diene monomer (EPDM), fluorosilicone (FVMQ), vinylidene fluoride (VDF), hexafluoropropylene (HFP), tetrafluoroethylene (TFE), perfluoromethylvinylether (PMVE), polydimethylsiloxane (PDMS), natural rubber, neoprene, polyurethane, silicone, silicone rubber, or combinations thereof. The insulating portion 102a and 102b can be described with regards to electrical insulation. In further embodiments, the insulating portion 102a and 102b can be internally porous, in that pores or voids are formed within the insulating portion 102a and 102b without affecting the permeability of the insulating portion 102a and 102b. Pores can be created through the use of a porogenic compound.

The electrical insulation of the insulating portion 102a and 102b can be described with relation to the dielectric constant, or κ value, of the material. In one embodiment, the insulating portion 102a and 102b can have a κ value of less than 5, such as a κ value of less than 3. The term elastomer, as used herein, means a material which can be stretched by an external force at room temperature (~20-25° C.) to at least twice its original length, and then upon immediate release of the external force, can return to its original length. Elastomers, as used herein, can include a thermoplastic, and may be cross-linked or thermoset.

The conducting portions 104a and 104b can be a largely internal layer of the fluid-impermeable membranes 110a and 110b. The conducting portions 104a and 104b can be conductive to electrical current, such that the conducting portion creates an electric field. In one embodiment, the conducting portions 104a and 104b is formed between the insulating portion 102a and 102b and the locking portions 106a and 106b. In another embodiment, the conducting portions 104a and 104b can include hydrogels. The conducting portions 104a and 104b can further include a polymer, an elastomeric polymer (elastomer) or both. Examples of elastomers usable as part of the conducting portions 104a and 104b can include nitrile, EPDM, fluorosilicone (FVMQ), vinylidene fluoride (VDF), hexafluoropropylene (HFP), tetrafluoroethylene (TFE), perfluoromethylvinylether (PMVE), polydimethylsiloxane (PDMS), natural rubber, neoprene, polyurethane, silicone, or combinations thereof. The conducting portions 104a and 104b can further include an electrically conductive dopant, such as silver, gold, platinum, copper, aluminum, or others. In further embodiments, the conducting portions 104a and 104b can include inks and adhesives, for the purpose of flexibility and/or conductivity.

The locking portions 106a and 106b can form an interior surface 112 of the fluid-impermeable membranes 110a and 110b. The locking portions 106a and 106b can be composed of a material similar to that of the insulating portion 102a and 102b. In one or more embodiments, the locking portions 106a and 106b can include an insulating elastomer, such as nitrile, EPDM, fluorosilicone (FVMQ), vinylidene fluoride (VDF), hexafluoropropylene (HFP), tetrafluoroethylene (TFE), perfluoromethylvinylether (PMVE), polydimethylsiloxane (PDMS), natural rubber, neoprene, polyurethane, silicone, or combinations thereof. In one or more embodiments, the locking portions 106a and 106b can include polymers and elastomers having a high electric breakdown voltage and not electrically conductive. The locking portions 106a and 106b can further include a particulate material 116. The particulate material 116 can be embedded in the locking portions 106a and 106b, as shown in FIG. 1A. In some arrangements, the particulate material 116 can be exposed on and/or form a part of the interior surface 112. The particulate material 116 can be uniform or varying in size or composition. Further, the particulate materials 116 can be non-conductive. In one or more embodiments, the particulate material 116 is particulate glass, silicon dioxide or carbide. In one or more embodiments, the particulate material 116 can be sand or grit.

The fluid-impermeable membranes 110a and 110b be sealed at one or more edges, such that the fluid-impermeable membranes 110a and 110b can form a fluid-impermeable compartment 118. The compartment can hold the dielectric fluid 114. The dielectric fluid 114 can be a fluid that is resistant to electrical breakdown and/or provides insulation. In one or more embodiments, the dielectric fluid 114 can prevent arcing between one or more opposing layers (e.g., the opposing conducting portions 104). The dielectric fluid 114 can be a lipid based fluid, such as a vegetable oil-based dielectric fluid. The dielectric fluid 114 can be ethylene glycol. The dielectric fluid 114 can have an associated dielectric constant, or κ value.

In one or more embodiments, any dissolved oxygen in the dielectric fluid can be minimized, such as through the addition of oxygen scavenging compounds. Oxygen may be used to polymerize some dielectric fluids, thus increasing viscosity and decreasing dielectric properties. Oxygen scavenging compounds which may be used in one or more embodiments include sodium sulfite, copper sulfate pentahydrate, hydrosulfite, calcium hydroxide, sodium bicarbonate, activated carbon, and combinations thereof. In further embodiments, the dielectric fluid 114 can include the particulate material 116, as depicted in FIG. 1B. In some embodiments, the particulate material 116 can be embedded in the locking portions 106a and 106b and included in the dielectric fluid 114.

FIG. 1C depicts the actuator 100 as an operating unit, according to one embodiment. In this embodiment, the fluid-impermeable membranes 110a and 110b, depicted in FIGS. 1A and 1B, are disposed against one another, the locking portion 106a and 106b forming the interior surface 112 of the compartment 118 and the dielectric fluid 114 disposed inside of the compartment 118. Forces 125 and 130 are applied to the actuator 100 from a first connection 135 to a first rigid surface 150 and a second connection 140 a second rigid surface 155, while the actuator 100 is in a relaxed state (i.e., no electrical current is being applied to the conducting portion 104). The forces 125 and 130 can be applied by separation between a first connection 135 and a second connection 140. The forces 125 and 130 can be applied by separation between the first connection 135 and the second connection 140.

Once the actuator 100 reaches a desired length or stretched state, an electric current can be delivered to the conducting portions 104a and 104b. The conducting portions 104a and 104b, as disposed on either side of the compartment 118 can then emit an electric field, such that the conducting portions 104a and 104b are attracted toward each other. As a result, the interior surfaces 112 can come together. At this point, the interior surface 112 forces the particulate material 116 into the locking portions 106a and 106b of the interior surface 112, which stops the continued stretching of the actuator 100 in the stretched state. The particulate material 116 on the opposing surfaces of the locking portions 106a and 106b can engage each other to facilitate a locking effect.

Figure 2A:
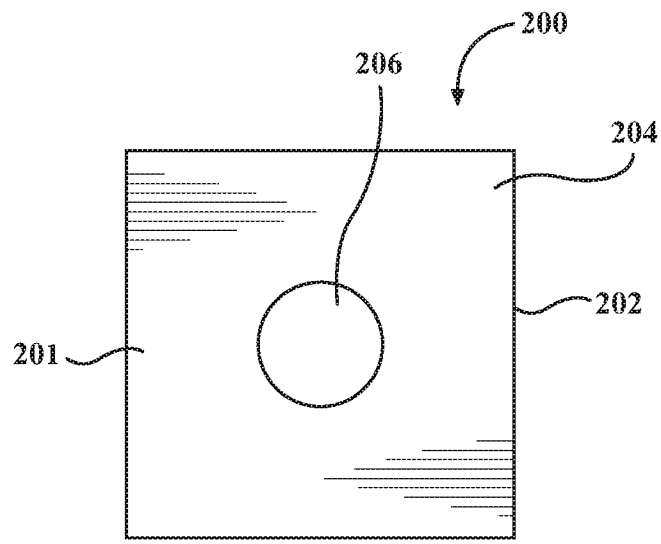
FIGS. 2A and 2B are depictions of tiles, according to one or more embodiments.
Figure 2B:
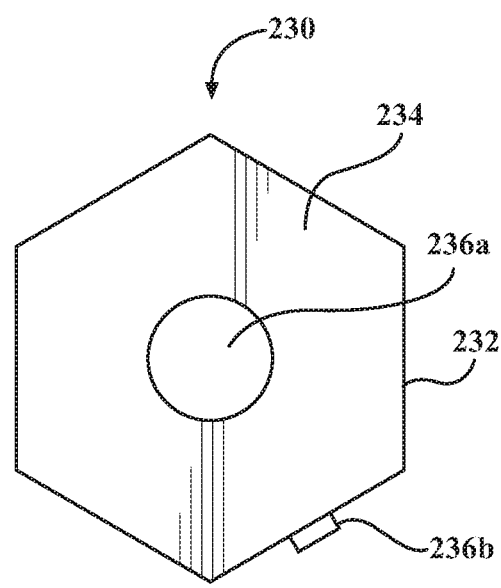

FIGS. 2A and 2B depict various individual tiles, according to one or more embodiments. The tiles, such as those depicted here at tile 200 and tile 230, can be interconnected as part of a network of tiles and actuators. As such, the tiles 200 and 230 can form a rigid portion of the programmable surface described herein. The tiles 200 and 230 can have a base 201. The base 201 can made of any suitable material, such as plastic. In one or more arrangements, the base 201 can be a rigid material. In one or more arrangements, the base 201 can be a resilient, semi-rigid, or flexible material. In one or more embodiments, the base 201 can be a substantially planar structure. In some arrangements, the tiles 200 and 230 can include one or more tile edges, which define the shape of the tile 200.

As shown in FIG. 2A, the tile 200 has four (4) tile edges 202. The tile edges 202 of the tile 200 are depicted as substantially flat and bounding a substantially flat outer surface 204. As used herein, the term "substantially"

includes exactly the term it modifies and slight variations therefrom. Thus, the term "substantially flat" means exactly flat and slight variations therefrom. In this particular example, slight variations therefrom can include within normal manufacturing tolerances, within about 10 degrees/percent or less, within about 5 degrees/percent or less, within about 4 degrees/percent or less, within about 3 degrees/percent or less, within about 2 degrees/percent or less, or within about 1 degrees/percent or less.

A switch 206 can be provided on the base. For example, the switch 206 can be located on the outer surface 204. In some embodiments, the switch 206 can be centrally located on the outer surface 204. In some embodiments, the switch 206 can be offset from the center of the outer surface 204. In some embodiments, there can be a plurality of switches provided on the outer surface 204. The plurality of switches can be distributed on the outer surface 204 in any suitable manner.

The switch 206 can be a pressure or contact responsive element, which can control the flow of electric current to one or more elements. When the tiles 200 are connected in conjunction with the actuator 100, the switch 206 can control the flow of electric current to the conducting portions 104a and 104b, described more fully with reference to FIG. 3. In one embodiment, the switch 206 can receive a force applied by the weight of an object placed on top of the tile 200. The switch 206 can then activate or stop the flow of electric current, as desired for one or more actuation purposes.

In FIG. 2B, the tile 230 has six (6) tile edges 232 and forms a hexagonal shape. Respectively, the tile 230 shows substantially flat tile edges 232 on all tile edges bounding a substantially flat outer surface 234. The tile 236 includes a plurality of switches, shown here as switches 236a and 236b. Located in the center of the outer surface 234 is a switch 236a, while switch 236b is located on a tile edge 232. The switches 236a and 236b is a pressure or contact responsive element, which can control the flow of electric current to one or more elements. When the tile 230 is connected in conjunction with the actuator 100, the switches 236a and 236b can control the flow of electric current to the conducting portions 104a and 104b. Though depicted in this embodiment as two switches 236a and 236b, one or more switches can be used in the embodiments described herein, including combinations of switches. In one example, the switch 236a comprises a touch sensitive switch and a pressure sensitive switch, while the switch 236b comprises a pressure sensitive switch. Further, though the switch 236a is shown as being located in the center of the tile 230 and switch 236b is shown located on the tile edge 232, the switches 236a and 236b can be located on any portion of the tile 230.

Figure 3:
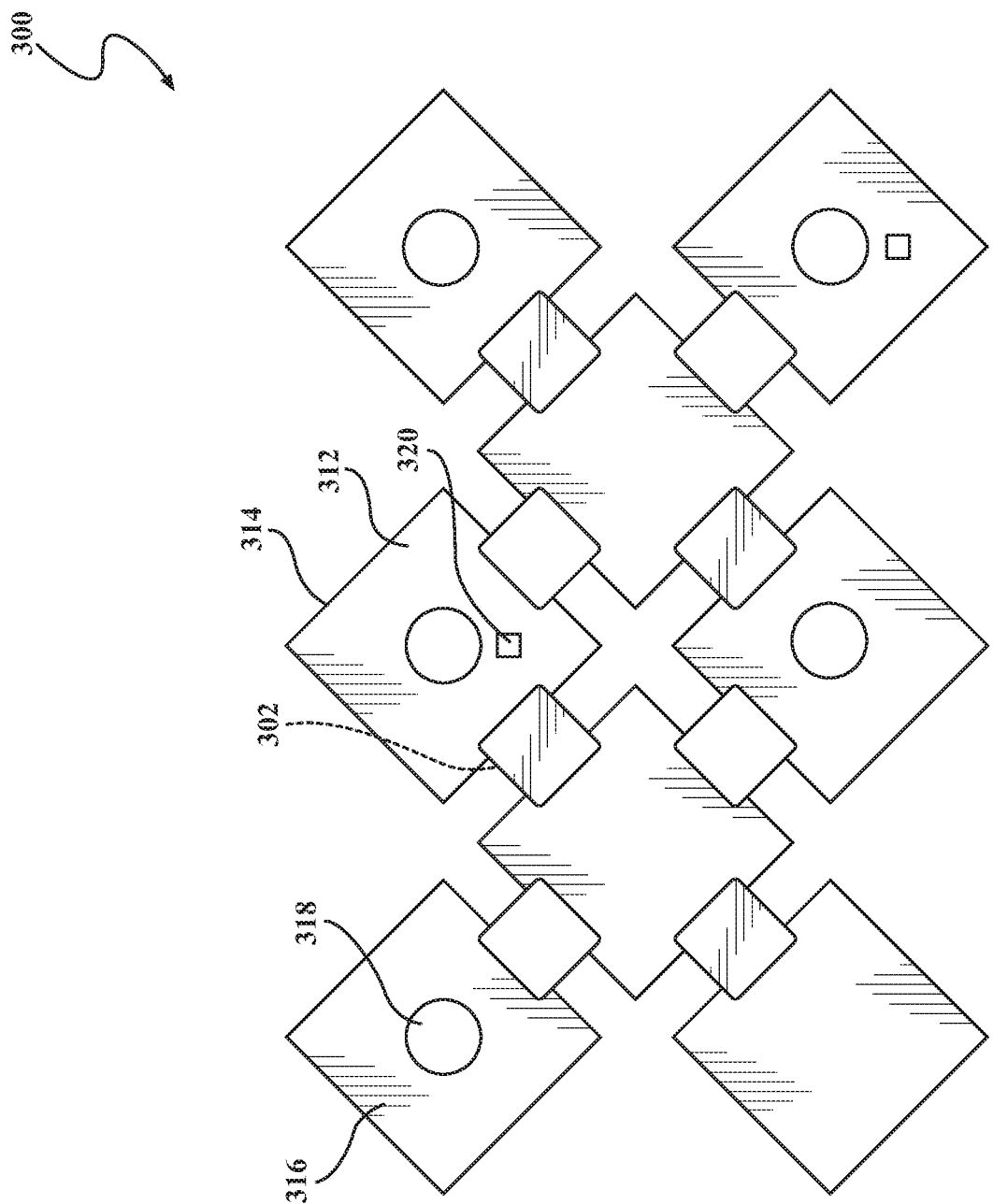
FIG. 3 is a programmable surface, according to one or more embodiments.

FIG. 3 depicts a programmable surface 300, according to one or more embodiments.

The programmable surface 300 comprises a plurality of actuators 302 and a plurality of tiles 312. The programmable surface 300 can include a network of actuators, such that the surface can be deformed by one or more forces to a second shape. Once the second shape is achieved, the programmable surface 300 can then receive and electric current and hold the second shape for a desired time frame. Once the desired time frame has passed, the electric current can be removed and the programmable surface 300 can return to the original shape. The programmable surface 300 can be deformed into a variety of shapes, based on the shape of an object, the direction of an applied force, the patterns of actuation and release, the formation and/or type of switches, or others as desired. The tiles 312 and the actuators 302 can be as large or as small as desired, per the desired deformation shape resolution. The tiles 312 can be substantially identical to each other, or one or more of the tiles 312 can be different from the other tiles 312 in one or more respects (e.g., size, shape, etc.). The actuators 302 can be substantially identical to each other, or one or more of the actuators 302 can be different from the other actuators in one or more respects.

Shown here are a plurality of tiles 312. The tiles 312 can be substantially similar in structure and/or design to the tiles 200 and 230, described above with reference to FIGS. 2A and 2B, or they can be different. The tiles 312, as shown here, are a square shape having four (4) tile edges 314. The tiles 312 can form a tessellation pattern, such that there is no overlap and no gaps. In further embodiments, the tiles 312 can form other arrangements where gaps are formed in the pattern. In such case, there can be a connecting material between the tiles, where one or more tiles overlap, or others. Further, though the tiles 312 are shown as having the same uniform shape, it is understood that a variety of shapes can be used, including tiles 312 having differing and/or non-uniform shapes within the same programmable surface 300. In one embodiment, the tiles 312 are a series of octagonal shaped tiles with square shaped tiles positioned to fill in square shaped gaps between them. Other shapes or combinations of shapes, whether tessellating, overlapping, gapped, or combinations thereof, are contemplated without specific recitation herein.

The tiles 312 can include a plurality of switches 318. The plurality of switches 318 are depicted, in this example, as being in the center of an exposed surface 316 in five (5) out of eight (8) of the tiles 312. However, the positioning of the switches 318 is not intended to be so limited. The switches 318 can be positioned such that contact with a force or an object can be transmitted to perform a function of the programmable surface 300. In one example, the switches 318 can be positioned such that typical objects which contact the tiles 312 of the programmable surface 300 will necessarily contact the switches 318. In further embodiments, the switches 318 can require activation from a group of the plurality of switches 318, before transmitting a signal. In another embodiment, one or more of the plurality of switches 318 can overlap multiple of the plurality of tiles 312, such that pressing a single switch requires contact with a plurality of the tiles 312. In one example of this embodiment, the switch 318 can be positioned at a corner edge of four tiles, such that when the tiles 312 are drawn together, a single switch 318 is formed by the four quadrants on the four tiles 312.

The tiles 312 can be connected with one or more actuators 302. The actuators 302 can be substantially similar to the actuators 100, described with reference to FIGS. 1A-1C. The actuators 302 can be connected to at least one of the tiles 312, such that the actuators 302 can be stretched with pressure or other forces applied to the programmable surface 300. The actuators 302 can have a stretch distance, as determined by the elasticity of the membrane materials, specific formation of the actuators 302, the amount of force applied, directionality of the force and others. The actuators 302 can be operatively connected to an inner side of the tiles 312. In one or more arrangements, an actuator 302 can be operatively connected to a plurality of the tiles 312. For example, as is shown in FIG. 3, one or more of the actuators 302 can be operatively positioned between two neighboring tiles 312.

The tiles 312 can provide an electrical signal which releases the actuators 302 when the switch 318 is depressed. The actuators 302 which are proximate or directly electrically connected to each of the tiles 312, can be controlled by the respective switch 318. In further embodiments, the switches may activate one another, such as in series or parallel. In another embodiment, the switches 318 can activate more distant actuators 302. More complex schemes for controlling the tiles 312, such as multiple switch 318 presses, varying levels of release based on the order or pressure of switches 318 activation, or others can be used. Once the switch 318 is no longer activated, or another signal is received, the actuators 302 can then be activated again, locking the actuators 302 at the current stretch position.

In another embodiment, the actuators 302 can include a feedback mechanism to inform a system of how much the actuators 302 have stretched. The actuators 302 may act as elastic capacitors with a specific capacitance which relates to the relative permittivity of the material. The specific capacitance of the material can be calculated as a function of the thickness and area of the material. When the structure of the actuators 302 is deformed by an external force or by an applied actuation voltage, the electrode area and/or dielectric thickness change, which results in a change in capacitance. The electrical behavior of the actuators 302 can be modeled as an RC circuit. Thus, the transient capacitance of the actuators 302 can be determined and applied as feedback indicating the level of stretch at the actuators 302.

With consideration of the capacitive features of the actuators 302, the actuators 302 and/or the tiles 312 can include one or more sensors 320. The sensors 320 can be capable of detecting the change in capacitance at one or more of the actuators 302. This change in capacitance can be provided to a computing device for use as part of a system, such as a computing device 500 and a surface control system 570, described with reference to FIG. 5. As such, the programmable surface 300 can be changed from a first shape to a second shape and locked into position in a second shape. Once the second shape is no longer desired, the second shape can be released and the programmable surface 300 can change shape back to the first shape due to the elasticity of the actuators 302.

Figure 4A:
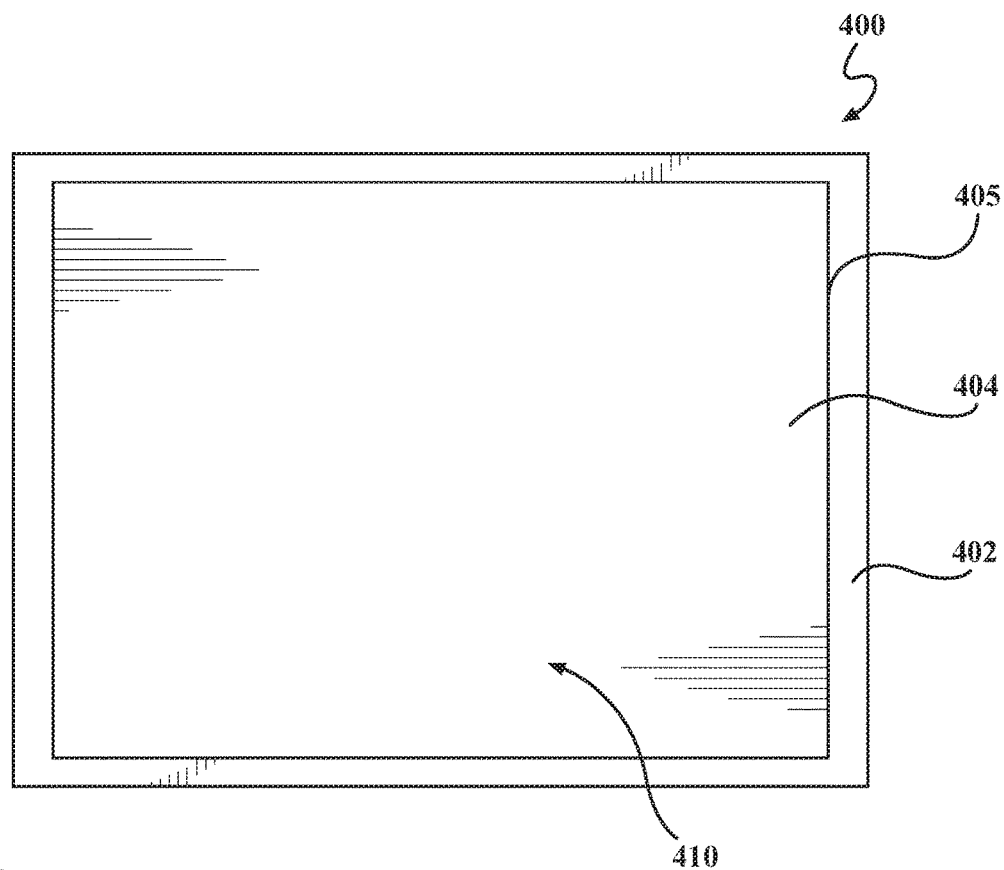
FIGS. 4A and 4B are implementations of the programmable surfaces as part of a programmable surface system, according to one or more embodiments.
Figure 4B:
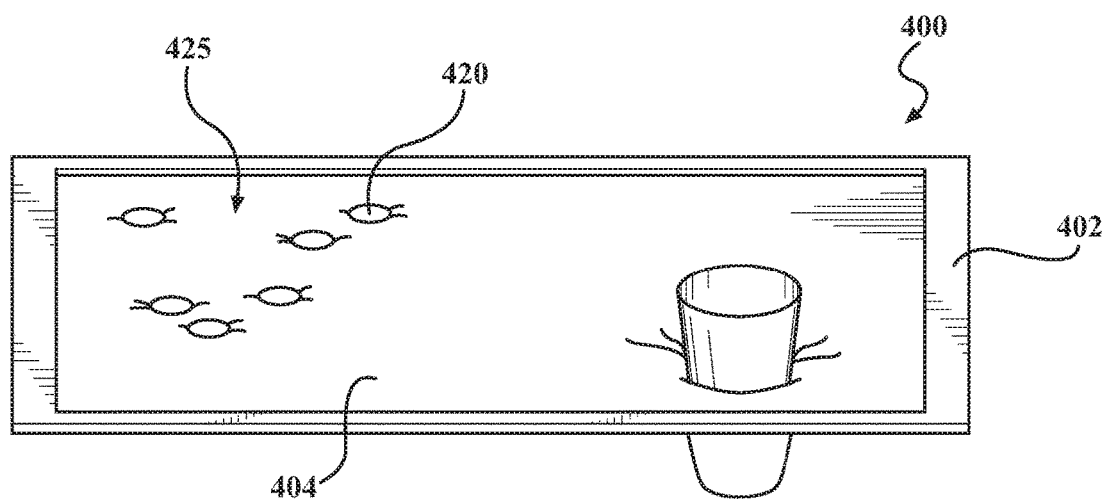

FIGS. 4A and 4B depict a programmable surface device 400 in use in an environment, according to one or more embodiments. The programmable surface device 400 can include a frame 402 and a programmable surface 404. The programmable surface 404 can be substantially similar to the programmable surface 300, described with reference to FIG. 3. The frame 402 can be positioned around the programmable surface 404, such as in connection with one or more edges 405. As such, the frame 402 can provide a mechanism of resistance for the force of an object applied to the programmable surface 404. The programmable surface 404 of the programmable surface device 400 can deform to match the shape, size and weight of the objects placed on the programmable surface 404. As such, the programmable surface can act as a universal holding device in a variety of environments, such as a home or vehicle.

FIG. 4A shows the programmable surface device 400 with the programmable surface 404 in a first state 410. The first state 410 can correspond to a substantially flat surface. In the first state 410, the programmable surface 404 can have minimum stretch, such as seen when no objects are supported by the surface. In some instances, the programmable surface 404 may be in an unlocked condition when in the first state. Alternatively, the programmable surface 404 can be in a locked state, such as when the actuators, such as actuators 302, are receiving an electric current and thus incapable of flexing and stretching. The frame 402 can be providing an external force to support the programmable surface 404. In further embodiments, the frame 402 can include or be in connection with a computing device, for transmission of one or more instructions.

FIG. 4B depicts the programmable surface device 400 after receiving one or more objects 420. The objects 420 as shown here include coins and a cup. However, this is not intending to be limiting, as any object which can benefit from being held can be supported by the programmable surface 404, as described herein. The objects 420 can rest on the programmable surface 404 of the programmable surface device 400. The weight of the objects 420 can activate the programmable surface 404, causing the programmable surface to release such that it is in an unlocked condition, which allows it to stretch at one or more portions, as described above with reference to FIGS. 1-3. In one or more embodiments, the release of the programmable surface 404 can be achieved through a series of switches, described above with reference to FIG. 3.

Once capable of stretching, the programmable surface 404 can deform to match the size and shape of the objects 420. In this embodiment, the force of gravity pulling on the objects 420, away from the frame 402, forces the deformation of the programmable surface 404. Once the objects 420 have reached a desired stretch interval (e.g., a second shape) in the programmable surface 404, the programmable surface device 400 can then lock the programmable surface 404 in place, such as in response to a user input. The programmable surface 404 can then hold the second shape regardless of whether the objects 420 are maintained in place or not. The deformation to the second shape can be held by actuation of one or more actuators, described above with reference to FIGS. 1-3. As such, the user can manipulate one or more of the objects 420 and the programmable surface 404 will maintain the shape needed to receive the object 420 again, without further interaction.

Once the user decided to release the second shape, or a predetermined event has occurred, the second shape can be released by the programmable surface device 400. The signal for release can be transmitted to the programmable surface device 400 by a number of mechanisms, such as a specific time frame, manual release, release based on the parameters of a system, or others. Once released, the programmable surface 404 will retract based on elasticity of the membrane to the original shape. Once in the original shape, the programmable surface can lock again, against the frame 402, such that the programmable surface device 400 can be later activated and the process can begin again. In one or more embodiments, the programmable surface device 400 can have a customer assigned surface topology (CAST), such that one or more desirable shapes of the programmable surface 404 can be achieved and maintained based on user preferences.

Figure 5:
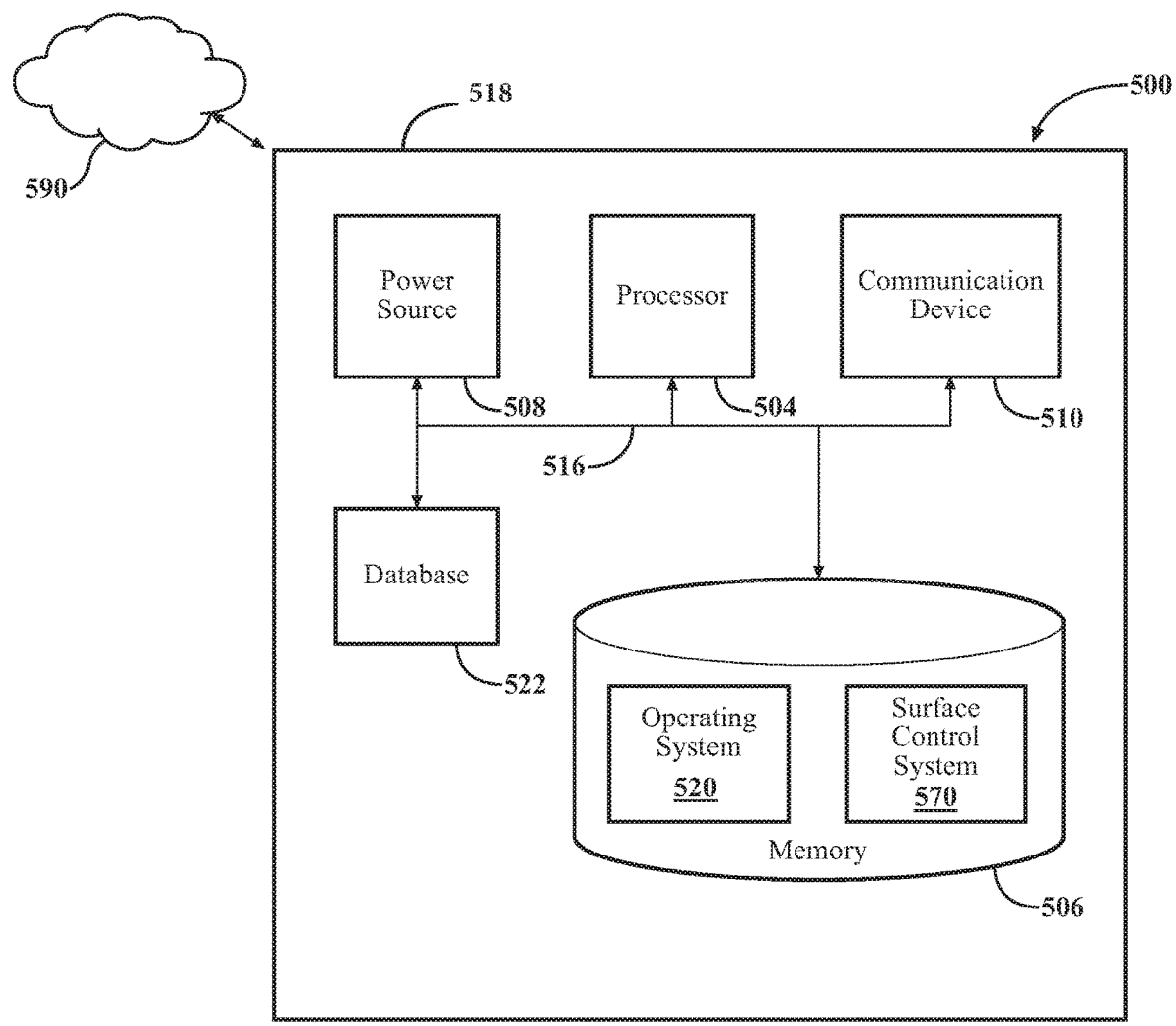
FIG. 5 is a computing device adaptable for use with one or more embodiments described herein.

FIG. 5 is a block diagram of the computing device 500 usable with the programmable surface described above, according to one or more embodiments. The computing device 500 can be any appropriate type of computing device such as, but not limited to, a server, a personal computer (PC), workstation, embedded computer, or stand-alone device with a computational unit, such as a microprocessor, DSP (digital signal processor), FPGA (field programmable gate array), or ASIC (application specific integrated circuit), or others. The computing device 500 can contain various components for performing the functions that are assigned to the computing device. The components can include a processor 504, like a central processing unit (CPU), a memory 506, a power source 508, communications device 510, input and/or output devices, and at least one bus 516 that connects the aforementioned components. In some embodiments, one or more of these components are at least partially housed within a housing 518.

The processor 504, which can also be referred to as a CPU, can be a device which is capable of receiving and executing one or more instructions to perform a task as part of a computing device. In one embodiment, the processor 504 can include a microprocessor such as an application specific instruction set processor (ASIP), graphics processing unit (GPU), a physics processing unit (PPU), a DSP, an image processor, a co-processor, or others. Though referenced as the processor 504, it is understood that one or more processors 504 can be used in one or more embodiments described herein, including combinations of processors 504.

The memory 506 is any piece of hardware that is capable of storing data or information. Examples of data or information which can be stored in the memory 506 include, without limitation, data, program code in functional form, and/or other suitable information either on a temporary basis and/or a permanent basis. The memory 506 can include one or more modules that include computer-readable instructions that, when executed by the processor 504, cause the processor 504 to perform methods and functions that are discussed herein. The memory 506 can include volatile and/or non-volatile memory. The memory 506 can further include a computer-readable storage medium. Examples of suitable memory 506 include RAM (Random Access Memory), flash memory, ROM (Read-Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof.

The memory 506 can be a component of the processor(s) 504, or the memory 506 can be operably connected to the processor(s) 504 for use thereby. The memory 506 can include an operating system 520, such as LINUX. The operating system 520 can include batch, live, time sharing, real time, and other types of operating systems. The operating system 520, as described herein, can include instructions for processing, accessing, writing, storing, searching data, or other functions as selected by the user for controlling and providing interface with the computing device 500. The memory 506 can include communications procedures for communicating with the network 590, the programmable surface 300, and/or another computing device.

The communication device 510 can be wired or wireless connection components and/or software allowing the computing device 500 to communicate with other computing devices. The communication device 510 can allow communication with devices either locally or remotely, such as over a network protocol (e.g., Ethernet or similar protocols). In one example, the computing device 500 is connected to the network 590 using the communication device 510. The communication device 510 can further be connected with remote devices associated with other computing devices. In further embodiments, the computing device 500 can connect with one or more computing devices, allowing access to one or more sensors, which are connected to or in connection with the second computing device.

The computing device 500 can further include a surface control system 570 or components thereof. As described herein, certain components of the surface control system 570 can be stored in the programmable surface 300, in the computing device 500 or in combinations thereof. As such, one or more embodiments of the surface control system 570 can include the surface control system 570, modules thereof, or components thereof as being stored, collected, created, compared or otherwise made available from the memory 506 or the database 522 of the computing device 500. When stored as part of the computing device 500, the surface control system 570 can access the programmable surface 300, another computing device 500, or other devices through the communications device 510 and the network 590, allowing for continuity between the one or more components which comprise the surface control system 570.

Figure 6:
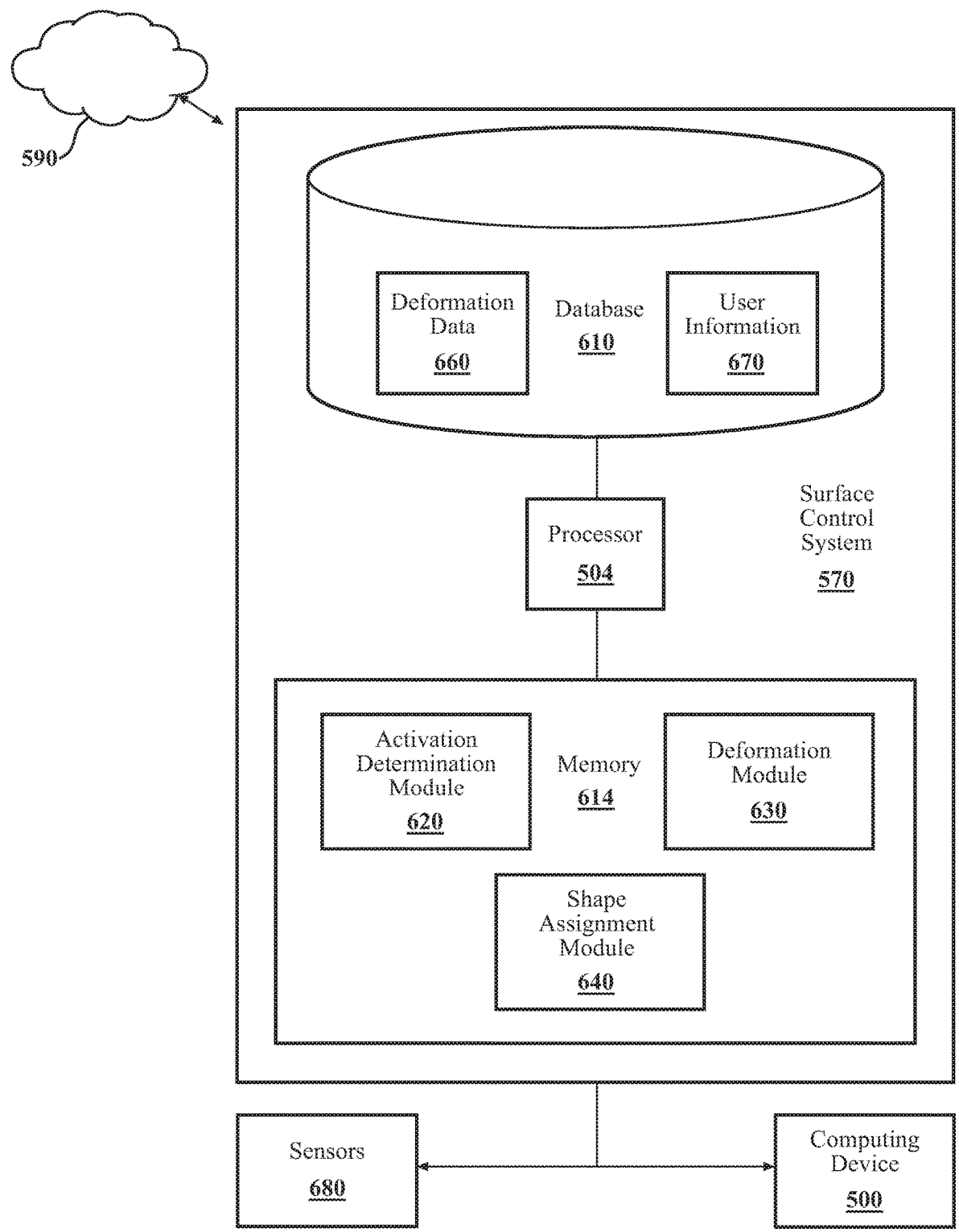
FIG. 6 is a surface control system for the programmable surface, according to one or more embodiments.

The discussion of the surface control system 570 begins at FIG. 6, with an illustration of the surface control system 570, according to one embodiment. The surface control system 570 is shown as including the processor 504 from the computing device 500, depicted in FIG. 5. Accordingly, the processor 504 can be a part of the surface control system 570, the surface control system 570 can include a separate processor from the processor 504 or the surface control system 570 can access the processor 504 through a data bus or another communication path. In one embodiment, the surface control system 570 includes the memory 614 that can store an activation determination module 620, a deformation module 630, and/or a shape assignment module 640. The memory 614 can be a RAM, ROM, a hard disk drive, a flash memory, or other suitable memory for storing the modules 620, 630, and 640. The modules 620, 630, and 640 are, for example, computer-readable instructions that when executed by the processor 504, cause the processor 504 to perform the various functions disclosed herein.

The surface control system 570 can further include a database 610. The database 610 can be presented in a number of configurations, including as part of the memory 614, as an independent component from the memory 614, as part of a separate memory (distinct from memory 614), or others. The database 610 can include deformation data 660 and user information 670. The deformation data 660 can include data sets as detected or determined about each of the actuators regarding maximum deformation, current deformation, useful life and other details which can be used to control the programmable surface during use. The user information 670 can include information related to selections for and uses of the programmable surface by a user. The surface control system 570 or portions thereof, can be stored as part of the computing device 500, as part of a server, or others. As such, one or more of the functions of the surface control system 570 or of the modules contained therein, can be performed remotely and transferred to programmable surface as part of the embodiments described herein.

The activation determination module 620 can generally include instructions that function to control the processor 504 to receive an activation signal from the programmable surface. The activation signal is a signal that a user or an object either intends to or is in the process of interacting with the programmable surface. The programmable surface, as used herein, can be substantially similar to the programmable surface described with reference to FIGS. 3-4B. The activation signal can be delivered to the activation determination module 620 based on the modulation of a switch, such as the switch described with reference to FIG. 3-4B above. The activation signal can be received directly by the activation determination module 620 or through a network, such as the network 590. The activation signal can further include individualized input or group input regarding one or more switches that are in connection with the programmable surface. In another embodiment, the activation signal is a signal delivered by the user indicating the desire to program the programmable surface, according to embodiments described herein. The individualized input can be stored as part of the user information 670 in the database 610.

The activation determination module 620 can further include instructions to release (e.g., unlock) one or more of the actuators of the programmable surface. The actuators can be substantially similar to the actuators, described with reference to FIGS. 1A-1C and 3. The actuators can be maintained in a locked state or an unlocked state, according to one or more embodiments described herein. When maintained in the locked state, the actuators can be released by reducing or removing the electric current at one or more of the actuators. The locking portion will then separate due to the removal of charge and the actuators will then become pliable. Once the membrane is pliable, the programmable surface is then responsive to one or more external forces which can cause deformation of the programmable surface.

The deformation module 630 can generally include instructions that function to control the processor 504 to detect a deformation level one or more of the actuators. The programmable surface can deform by one or more forces changing the shape of the actuators. Deformation, as used herein, refers to the changing of shape of the programmable surface as a whole or the stretching of one or more of the actuators. As described above, the programmable surface can change shape due to gravitational forces from one or more objects or other applied forces against the programmable surface. Further, the programmable surface can change shape at specific locations, such as when a selection of the actuators has been released. The deformation module 630 can detect the deformation of the programmable surface by a number of mechanisms, such as external sensors, detection of capacitance of the membrane, or others. The deformation module 630 can further detect differences in deformation between the actuators, such that each of the actuators are analyzed individuals. In further embodiments, the deformation of the programmable surface can be analyzed in groups or as a whole, based on the desires of the user. The deformation levels can then be stored by the deformation module 630 in the deformation data 660 of the database 610. In further embodiments, the levels of deformation can then be forwarded to the shape assignment module 640 for further application in the system 570.

The shape assignment module 640 can generally include instructions that function to control the processor 504 to activate the actuators at a desired deformation level. Once the programmable surface has reached a desired state or a state limited by one or more secondary factors (e.g., maximum stretch capacity), the shape assignment module 640 can activate one or more of the actuators to assign the shape to the programmable surface. Once the actuators are activated again, the elasticity of the actuators will again be limited. In this way, the programmable surface can hold a specific shape as desired or based on one or more parameters set by the surface control system 570.

Thus the surface control system 570 and the programmable surface can regulate the movement of the programmable surface. The programmable surface can change from a first shape to a second shape, and each shape can be held by the actuators, such that the shape no longer requires external forces to be maintained. The programmable surface can provide numerous benefits. The programmable surface can assist in space conservation, by performing multiple standard tasks for storage or holding, on demand. Further, the programmable surface can replace numerous devices which have become standard in vehicles and in households, allowing for a variety of applications. The surface control system 570 can add a level of modulation to the programmable surface, allowing the programmable surface to be intelligently controlled.

Detailed embodiments are disclosed herein. However, it is to be understood that the disclosed embodiments are intended only as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Further, the terms and phrases used herein are not intended to be limiting but rather to provide an understandable description of possible implementations. Various embodiments are shown in FIGS. 1-6, but the embodiments are not limited to the illustrated structure or application.

The flowcharts and block diagrams in the figures illustrate the architecture, functionality, and operation of possible embodiments of systems, methods and computer program products according to various embodiments. In this regard, each block in the flowcharts or block diagrams can represent a module, segment, or portion of code, which can include one or more executable instructions for implementing the specified logical function(s). It should also be noted that, in some alternative embodiments, the functions noted in the block can occur out of the order noted in the figures. For example, two blocks shown in succession can, in fact, be executed substantially concurrently, or the blocks can sometimes be executed in the reverse order, depending upon the functionality involved.

The systems, components and/or methods described above can be realized in hardware or a combination of hardware and software and can be realized in a centralized fashion in one processing system or in a distributed fashion where different elements are spread across several interconnected processing systems. Any kind of processing system or other apparatus adapted for carrying out the methods described herein is suited. A typical combination of hardware and software can be a processing system with computer-usable program code that, when being loaded and executed, controls the processing system such that it carries out the methods described herein. The systems, components and/or methods also can be embedded in a computer-readable storage, such as a computer program product or other data programs storage device, readable by a machine, tangibly embodying a program of instructions executable by the machine to perform methods and methods described herein. These elements also can be embedded in an application product which can include all the features enabling the embodiment of the methods described herein and, which when loaded in a processing system, is able to carry out these methods.

Furthermore, arrangements described herein can take the form of a computer program product embodied in one or more computer-readable media having computer-readable program code embodied or embedded, such as stored thereon. Any combination of one or more computer-readable media can be utilized. The computer-readable medium can be a computer-readable signal medium or a computer-readable storage medium. The phrase "computer-readable storage medium" means a non-transitory storage medium. A computer-readable storage medium can be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk drive (HDD), a solid state drive (SSD), a RAM, a ROM, an EPROM or Flash memory, an optical fiber, a portable compact disc read-only memory (CD-ROM), a digital versatile disc (DVD), an optical storage device, a magnetic storage device, or any suitable combination of the foregoing. In the context of this document, a computer-readable storage medium can be any tangible medium that can contain, or store a program for use by or in connection with an instruction execution system, apparatus, or device.

Program code embodied on a computer-readable medium can be transmitted using any appropriate medium, including but not limited to wireless, wireline, optical fiber, cable, RF, etc., or any suitable combination of the foregoing. Computer program code for carrying out operations for aspects of the present arrangements can be written in any combination of one or more programming languages, including an object-oriented programming language such as Java™ Smalltalk, C++ or the like and conventional procedural programming languages, such as the "C" programming language or similar programming languages. The program code can execute entirely on the user's computer, partly on the user's computer, as a stand-alone software package, partly on the user's computer and partly on a remote computer, or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider).

The terms "a" and "an," as used herein, are defined as one as or more than one. The term "plurality," as used herein, is defined as two or more than two. The term "another," as used herein, is defined as at least a second or more. The terms "including" and/or "having," as used herein, are defined as including (i.e., open language). The phrase "at least one of . . . and . . . " as used herein refers to and encompasses any and all possible combinations of one or more of the associated listed items. As an example, the phrase "at least one of A, B and C" includes A only, B only, C only, or any combination thereof (e.g., AB, AC, BC or ABC).

While the foregoing is directed to embodiments of the disclosed devices, systems, and methods, other and further embodiments of the disclosed devices, systems, and methods can be devised without departing from the basic scope thereof. The scope thereof is determined by the claims that follow.

What is claimed is:

1. An actuator comprising:
a locking portion comprising a locking insulating elastomer, the locking portion including an inner surface forming at least a portion of a fluid-impermeable compartment, the fluid-impermeable compartment including a dielectric fluid and a particulate material;
a first conducting portion connected to an outer surface of the locking portion, the first conducting portion comprising a conducting elastomer; and
a second conducting portion connected to an outer surface of the locking portion, the second conducting portion comprising a conducting elastomer, the second conducting portion being separated from the first conducting portion by the fluid-impermeable compartment; and
an insulating portion surrounding an exterior surface of the first conducting portion and the second conducting portion, the insulating portion comprising an insulating elastomer.

2. The actuator of claim 1, further comprising a particulate material embedded in the locking portion.

3. The actuator of claim 1, wherein the dielectric fluid comprises one or more oxygen scavenging compounds.

4. The actuator of claim 1, wherein the locking portion is configured to maintain a first position upon receipt of an electric input and release the first position upon withdrawal of the electric input.

5. The actuator of claim 1, wherein the insulating portion contains one or more plastics or elastomers to control direction of elasticity.

6. The actuator of claim 1, wherein the first conducting portion is located and encapsulated between the locking portion and the insulating portion, and wherein the second conducting portion is encapsulated between the locking portion and the insulating portion.

7. A programmable surface, comprising:
a tile, including:
a base having an upper surface; and
a switch to alter an electric current in response to an input; and
a power source in electrical communication with the switch; and
an actuator attached to the tile, the actuator being in electrical communication with the electric current, the actuator comprising:
a locking portion comprising a locking insulating elastomer, the locking portion including an inner surface forming at least a portion of a fluid-impermeable compartment, the fluid-impermeable compartment including a dielectric fluid and a particulate material;
a first conducting portion connected to an outer surface of the locking portion, the first conducting portion comprising a conducting elastomer; and
a second conducting portion connected to an outer surface of the locking portion, the second conducting portion comprising a conducting elastomer, the second conducting portion being separated from the first conducting portion by the fluid-impermeable compartment; and
an insulating portion surrounding an exterior surface of the first conducting portion and the second conducting portion, the insulating portion comprising an insulating elastomer.

8. The programmable surface of claim 7, wherein the tile is a plurality of tiles, and wherein the plurality of tiles form a tessellation pattern.

9. The programmable surface of claim 7, wherein the switch is a pressure sensitive switch.

10. The programmable surface of claim 7, wherein the tile comprises a webbing connected with a tile edge.

11. The programmable surface of claim 7, wherein the tile is in connection with a plurality of tiles, the plurality of tiles forming a tessellation pattern.

12. The programmable surface of claim 11, wherein the plurality of tiles are connected to one or more actuators, the switch being activated to deactivate a selection of the one or more actuators.

13. The programmable surface of claim 12, wherein the one or more actuators in direct connection with the tile is deactivated by activating the switch.

14. The programmable surface of claim 7, further comprising the particulate material being embedded in the locking portion.

15. A programmable surface system, comprising:
a programmable surface comprising a plurality of tiles and a plurality of actuators; and
a surface control system for controlling a programmable surface, comprising:
one or more processors; and
a memory communicably coupled to the one or more processors and storing:
an activation determination module including instructions that when executed by the one or more processors cause the one or more processors to release one or more of the actuators in response to an activation signal received from the programmable surface, the release involving removing an electrical current from the actuators; and
a shape assignment module including instructions that when executed by the one or more processors cause the one or more processors to activate the actuators at a desired deformation level.

16. The programmable surface system of claim 15, wherein the activation determination module further comprises instructions to determine a location of the activation signal in the programmable surface.

17. The programmable surface system of claim 15, wherein the activation signal is a signal from a switch.

18. The programmable surface system of claim 15, wherein the plurality of tiles comprises one or more switches, the switches altering an electric current in response to an input; and the plurality of actuators are positioned between each of the plurality of tiles and in electrical communication with the electric current.

19. The programmable surface system of claim 15, further comprising a deformation module, the deformation module including instructions that when executed by the one or more processors cause the one or more processors to detect a deformation level one or more of the actuators.

20. The programmable surface system of claim 15, wherein the shape assignment module further comprises instructions to asynchronously activate or deactivate one or more of the plurality of actuators.

* * * * *